(12) United States Patent
Usami et al.

(10) Patent No.: US 7,372,460 B2
(45) Date of Patent: May 13, 2008

(54) METHOD AND PROGRAM FOR GENERATING VOLUME DATA FROM BOUNDARY REPRESENTATION DATA

(75) Inventors: Shugo Usami, Saitama (JP); Kiwamu Kase, Saitama (JP); Yu-ichiro Terada, Shizuoka (JP); Hiroshi Yagi, Shizuoka (JP)

(73) Assignee: Riken, Saitama (JP)

( * ) Notice: Subject to any disclaimer, the term of this patent is extended or adjusted under 35 U.S.C. 154(b) by 195 days.

(21) Appl. No.: 10/595,047

(22) PCT Filed: Jul. 14, 2004

(86) PCT No.: PCT/JP2004/010023

§ 371 (c)(1),
(2), (4) Date: Jan. 17, 2006

(87) PCT Pub. No.: WO2005/008547

PCT Pub. Date: Jan. 27, 2005

(65) Prior Publication Data

US 2007/0057938 A1     Mar. 15, 2007

(30) Foreign Application Priority Data

Jul. 16, 2003     (JP) .............................. 2003-275055

(51) Int. Cl.
*G06T 17/00*     (2006.01)

(52) U.S. Cl. ..................................... 345/419

(58) Field of Classification Search ................ 600/410; 345/419
See application file for complete search history.

(56) References Cited

U.S. PATENT DOCUMENTS 4,092,201 A     5/1978     Wommelsdorf
(Continued)

FOREIGN PATENT DOCUMENTS

EP         0 938 949 A1     9/1999
(Continued)

OTHER PUBLICATIONS

Teshima, Yoshinori et al., "Shape Approximation, Cube Cutting and Enumeration", ISM Symposium 2003—Statistics, Combinatorics and Geometry. p. 9, 2003.
(Continued)

*Primary Examiner*—Almis R. Jankus
(74) *Attorney, Agent, or Firm*—Griffin & Szipl, P.C.

(57) ABSTRACT

A data input means inputs boundary data of an object to a computer, a data converting means converts the boundary data into a triangle patch having a phase, an associating means divides a space into rectangular parallelepiped cells having boundary planes intersecting perpendicularly and associates the cell with a triangle to be included in the cell, a dividing/arranging means divides a triangle patch having a phase and floating in the space at cell faces and keeps all triangles arranged within and on the boundaries of cells, a ridge line integrating means integrates ridges that do not alter the phase, a cell assigning means assigns each triangle and its vertex to a cell with reference to index data of the vertex, and a labeling means sets an attribute value of each cell.

8 Claims, 12 Drawing Sheets

V-CAD Data Structure

U.S. PATENT DOCUMENTS

| | | | |
|---|---|---|---|
| 4,665,492 | A | 5/1987 | Masters |
| 4,694,404 | A | 9/1987 | Meagher |
| 4,710,876 | A | 12/1987 | Cline et al. |
| 4,719,585 | A | 1/1988 | Cline et al. |
| 4,729,098 | A | 3/1988 | Cline et al. |
| 5,095,419 | A | 3/1992 | Seki et al. |
| 5,166,876 | A | 11/1992 | Cline et al. |
| 5,197,013 | A | 3/1993 | Dundorf |
| 5,303,141 | A | 4/1994 | Batchelder et al. |
| 5,345,490 | A | 9/1994 | Finnigan et al. |
| 5,510,066 | A | 4/1996 | Fink et al. |
| 5,517,602 | A | 5/1996 | Natarajan |
| 5,594,652 | A | 1/1997 | Penn et al. |
| 5,796,617 | A | 8/1998 | St. Ville |
| 5,807,448 | A | 9/1998 | Nakazawa |
| 6,075,538 | A | 6/2000 | Shu et al. |
| 6,136,252 | A | 10/2000 | Bedal et al. |
| 6,214,279 | B1 | 4/2001 | Yang et al. |
| 6,405,095 | B1 | 6/2002 | Jang et al. |
| 6,445,390 | B1 | 9/2002 | Aftosmis et al. |
| 6,471,800 | B2 | 10/2002 | Jang et al. |
| 6,504,742 | B1 | 1/2003 | Tran et al. |
| 6,606,528 | B1 | 8/2003 | Hagmeier et al. |
| 6,618,607 | B2 * | 9/2003 | Song .................... 600/410 |
| 6,627,835 | B1 | 9/2003 | Chung et al. |
| 6,639,597 | B1 | 10/2003 | Zwicker et al. |
| 6,643,560 | B2 | 11/2003 | Shimomura |
| 6,968,075 | B1 | 11/2005 | Chang |
| 6,982,710 | B2 | 1/2006 | Salomie |
| 7,088,363 | B2 | 8/2006 | Kase et al. |
| 7,110,852 | B2 | 9/2006 | Ohmori et al. |
| 2002/0004713 | A1 | 1/2002 | Wakabayashi et al. |
| 2002/0055692 | A1 | 5/2002 | Tanaka et al. |
| 2002/0113331 | A1 | 8/2002 | Zhang et al. |
| 2003/0001836 | A1 | 1/2003 | Ernst et al. |
| 2004/0267400 | A1 | 12/2004 | Ohmori et al. |
| 2005/0015173 | A1 | 1/2005 | Ohmori et al. |
| 2006/0228248 | A1 | 10/2006 | Larsson |

FOREIGN PATENT DOCUMENTS

| | | |
|---|---|---|
| EP | 1 229 463 A2 | 8/2002 |
| JP | 02-236677 | 9/1990 |
| JP | 03-021432 | 1/1991 |
| JP | 04-07580 | 3/1992 |
| JP | 06-315849 | 11/1994 |
| JP | 06-348862 | 12/1994 |
| JP | 07-057089 | 3/1995 |
| JP | 07-334541 | 12/1995 |
| JP | 10-063873 | 3/1998 |
| JP | 11-096400 | 4/1999 |
| JP | 2000-182081 | 6/2000 |
| JP | 2000-194881 | 7/2000 |
| JP | 2000-340476 | 12/2000 |
| JP | 2001-022961 | 1/2001 |
| JP | 2001-025023 | 1/2001 |
| JP | 2001-225393 | 8/2001 |
| JP | 2001-370040 | 12/2001 |
| JP | 2002-024306 | 1/2002 |
| JP | 2002-230054 | 8/2002 |
| JP | 2003-044528 | 2/2003 |
| JP | 2004-334640 | 11/2004 |
| WO | 02/23408 A1 | 3/2002 |
| WO | 03/048980 | 6/2003 |
| WO | 03/073335 | 9/2003 |

OTHER PUBLICATIONS

Teshima, Yoshinori et al., "Enumeration on Cube Cutting", pp. 87-88.

Hoffmann, Christoph M., "The Problems of Accuracy and Robustness in Geometric Computation", Mar. 1989, pp. 31-41.

Ju, Tao, et al. "Dual Contouring of Hermite Data".

Schroeder, William J., "A Topology Modifying Progressive Decimation Algorithm".

Schroeder, William J., et al., "Decimation of Triangle Meshes".

Renze, Kevin J., et al., "Generalized Surface and Volume Decimation for Unstructured Tessellated Domains", Proceedings of VRAIS '96, pp. 111-121, 1996.

Hamann, Bernd, "A Data Reduction Scheme for Triangulated Surfaces", Computer Aided Geometric Design 11, pp. 197-214, 1994.

Navazo, I., "Extended Octtree Representation of General Solids with Plane Faces; Model Structure and Algorithms", Comput. & Graphics, vol. 13, No. 1, pp. 5-16, 1989.

Hoppe, Hugues et al. "Mesh Optimization".

Hoppe, Hugues, "Progressive Meshes".

Lindstrom, Peter et al., "Evalutation of Memoryless Simplification", IEEE Transactions on Visualization and Computer Graphics, vol. 5, No. 2, pp. 98-115, Apr.-Jun. 1999.

Garland, Michael et al., "Surface Simplification Using Quadric Error Metrics".

Sugihara, Kokichi et al., "A Solid Modelling System Free from Topological Inconsistency", Journal of Information Processing, vol. 12, No. 4., pp. 380-393, 1989.

Kela, Ajay, "Hierarchical Octree Approximations for Boundary Representation-Based Geometric Models", Computer-Aided Design 21, No. 6, London, pp. 355-362, Jul.-Aug. 1989.

Navazo, I. et al., "A Geometric Modeller based on the Exact Octtree Representation of Polyhedra", Computer Graphics Forum 5, pp. 91-104, 1986.

Lorensen, William E. et al., "Marching Cubes: A High Resolution 3D Surface Construction Algorithm", Computer Graphics, vol. 21, No. 4, pp. 163-169.

Hama, Takayuki et al., "A Stable and Fast New Contact Search Algorithm for FEM Simulation of Metal Forming Process", JSME/ASME International Conference on Materials and Processing, Oct. 15-18, 2002, Honolulu, pp. 367-372.

Kase, K. et al., "Volume CAD", Volume Graphics, pp. 145-173, 2003.

International Search Report issued in corresponding application No. PCT/JP2004/010023 completed Aug. 25, 2004 and mailed Sep. 14, 2004.

Avila, Ricardo S., et al., "A Haptic Interaction Method for Volume Visualization," Oct. 27, 1996, pp. 197-204.

Ayalya, D., et al., "Object Representation by Means of Nonminimal Division Quadtrees and Octrees," ACM Transactions on Graphics, Jan. 1985, pp. 41-59, vol. 4, No. 1.

Yonekawa, Kazutoshi et al., "A Geometric Modeler by Using Spatial-Partitioning Representations," vol. 37, No. 1, Jan. 1996, pp. 60-69.

Piegl, Leslie et al., "Tessellating trimmed NURBS surfaces," Computer-Aided Design, Jan. 1995, pp. 16-26, Volume 24, No. 1, Great Britain.

Roy, U., et al., "Computation of a geometric model of a machined part from its NC machining programs," Computer-Aided Design, 1999, pp. 401-411, No. 31.

Shute, Gary, "Overview of C Programming," Aug. 23, 1999, http://www.d.umn.edu/~gshute/C/overview.html, printed Nov. 1, 2004.

Yamaguchi, K. et al, "Computer-Integrated Manufacturing of Surfaces Using Octree Encoding," IEEE CG&A, Jan. 1984, pp. 60-62.

Zesheng, Tang, "Octree Representation and Its Applications in CAD," Journal of Computer Science and Technology, 1992, pp. 29-38, vol. 7, No. 1.

Office Action issued in related U.S. Appl. No. 10/482,919 dated Feb. 7, 2007.

Haley, Michael B., "Incremental Volume Rendering Using Hierarchical Compression," Eurographics '96 vol. 15, No. 3, 1996, pp. 45-55.

Ward, Gregory J., "The RADIANCE Lighting Simulation and Rendering System," Computer Graphics Proceedings, Annual Conference Series, 1994, pp. 459-472.

Roy, Uptal et al., "3-D Object Decomposition with Extended Octree Model and its Application in Geometric Simulation of NC Machining," Robotics and Computer-Integrated Manufacturing 14, 1998, pp. 317-327.

Shepard, M.S. et al., "Parallel Automatic Adaptive Analysis," Parallel Computing 23, 1997, pp. 1327-1347.

European Search Report issued in related application No. EP 02743831.6, completed Mar. 23, 2007 and mailed Apr. 3, 2007.

Office Action issued in related U.S. Appl. No. 10/505,224, dated Jan. 24, 2007.

Kobbelt, Leif P. et al., "Feature Sensitive Surface Extraction from Volume Data," ACM SIGGRAPH 2001, Aug. 12-17, 2001, pp. 47-66.

Brunet, Pere et al., "Solid Representation and Operation Using Extended Octrees," ACM Transactions on Graphics, vol. 9, No. 2, Apr. 1990, pp. 170-197.

Pfister, Hanspeter et al., "Cube-4—A Scalabel Architecture for Real-Time Volume Rendering," IEEE 1996, pp. 47-54, 100.

Wallin, Ake, "Constructing Isosurfaces from CT Data," IEEE Computer Graphics & Applications, IEEE 1991, pp. 28-33.

Office Action dated May 7, 2007 in related U.S. Appl. No. 10/486,653.

Okamoto, Katsunari et al., "Stress Analysis of Optical Fibers by a Finite Element Method," Oct. 1981, IEEE vol. QE-17, No. 10, pp. 2123-2129.

Office Action issued in related application No. 10/482,919, dated Jun. 29, 2007.

Ramesh, R., et al. "Error compensation in machine tools—a review Part 1: geometric, cutting-force induced and fixture-dependent errors," International Journal of Machine Tools & Manufacture 40 (2000) pp. 1235-1256.

Liu, Qing, "Form-Accuracy Analysis and Prediction in Computer-Integrated Manufacturing," International Journal of Machine Tools & Manufacture, vol. 37, No. 3, 1997, pp. 234-248.

Supplementary European Search Report issued in related application No. EP 02 76 0631, completed Sep. 12, 2007.

Office Action issued in related U.S. Appl. No. 10/486,653, dated Oct. 18, 2007.

* cited by examiner

V-CAD Data Structure

Flow Chart isolated polyhedron on-plane point connection on-the-same-edge connection boundary point bent shape FIG.10
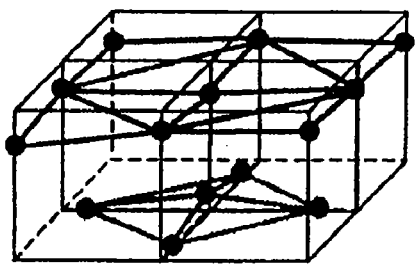
through shape
FIG.11A 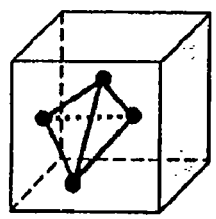 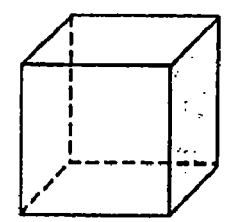 FIG.11B
processing of isolated polyhedron (triangle patch)
FIG.12A
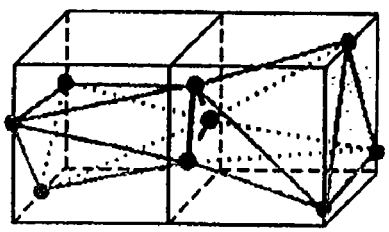
FIG.12B
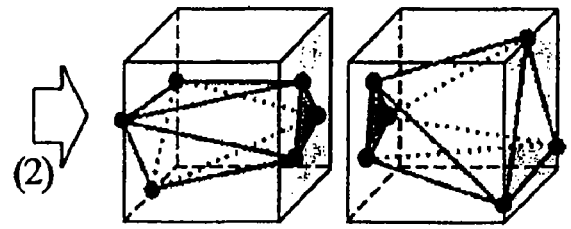
FIG.12C
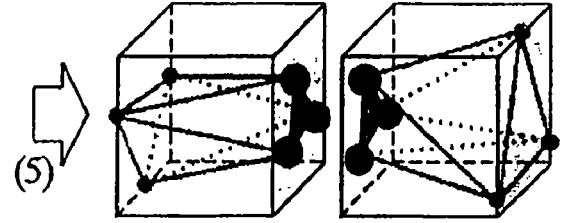
processing of connected patch via on-plane point (4)

(5)

processing (1) of one edge plurality of cutting points, boundary point processing (2) of one edge plurality of cutting points, bending point processing (3) of one edge plurality of cutting points, two through planes On Face Cutting Points Color Plate Molding Part
Up Left       : B-rep Data
Up Right      : Volume Data(32x128x32)
Down Left     : Voxel( 32x128x32 )
Down Center   : Octree
Down Right    : Voxel( 64x256x64 )

Left  : Original
Right : Subtraction
        (Yellow - Blue)

Boolean Operation for Sticking two Item

METHOD AND PROGRAM FOR GENERATING VOLUME DATA FROM BOUNDARY REPRESENTATION DATA

This is a National Phase Application in the United States of International Patent Application No. PCT/JP2004/010023 filed Jul. 14, 2004, which claims priority on Japanese Patent Application No. 275055/2003, filed Jul. 16, 2003 The entire disclosures of the above patent applications are hereby incorporated by reference.

TECHNICAL FIELD

The present invention relates to a method for generating volume data which can unify CAD and simulation by storing the volume data that integrates a shape and physical properties by a small storage capacity, and more particularly to a method and a program for adapting a triangle patch frequently used as an input surface shape to a cell having a designated size.

BACKGROUND ART

In a field of advanced research and development, a higher level/complexity thereof has made a great many trials and errors absolutely necessary, increasing risks on the way of developments. In Japan that depends on science and technology for its survival, it is extremely important to achieve an unprecedentedly high level/efficiency of a development process by eliminating such risks as many as possible.

In the field of research and development, computer aided design (CAD), computer aided manufacturing (CAM), computer aided engineering (CAE), computer aided testing (CAT), and the like are currently used as simulation means of designing, fabricating, analyzing and testing.

Moreover, according to the present invention, cooperative simulation (C-Simulation) which is continuous simulation, advanced CAM (A-CAM) which takes a fabrication process into consideration, deterministic fabrication (D-fabrication) which can achieve ultimate accuracy and the like must come into wide use.

According to such conventional simulation means, data of an object is stored based on constructive solid geometry (CSG) or boundary representation (B-rep).

In the case of CSG, however, the entire object is stored as an aggregation of very small solid models. Consequently, if data is heavy and simulation means (software or the like) is mounted, enormous data must be processed, causing a problem of much time necessary for analysis even when a large scale computer is used.

In the case of the B-rep, the object is represented by a boundary. Thus, while data is light and an amount of data is small, there is no direct information regarding the inside of a boundary surface, causing a problem of unsuitability to deformation analysis.

Furthermore, according to the conventional data storage means, each time thermal/fluid analysis, large solid analysis, coupled analysis thereof or the like is carried out, division is made in a mesh form suited to the analysis, and a result of the analysis can be displayed to apply a finite element method. However, unification of CAD and simulation is difficult, causing a problem of impossibility of managing the processes of designing, analyzing, fabricating, assembling, testing and the like based on the same data.

In other words, the following problems are inherent in the current solid/surface-CAD (referred to as S-CAD hereinafter):

(1) data is not passed, inferior in internal conversion operation (problems of numerical value error and processing method);

(2) direct use is impossible for simulation (mesh must be formed because there is not any internal information); and (3) investigation of fabrication by CAM is impossible (only last shape is given).

Additionally, the following problems are inherent in fabrication:

(1) a fabrication process cannot be represented (rough fabrication or process design assistance is insufficient);

(2) dealing with a new fabrication method such as laser fabrication or superadvanced fabrication is impossible (only cutting is available, numerical value accuracy is insufficient); and (3) a fabrication method itself cannot be selected (different material characteristics are given in compound material).

To solve the aforementioned problems, the inventors et. al have invented "Method for storing substantial data that integrates shape and physical properties", and filed a patent application [Patent Document 1].

According to this invention, as schematically shown in FIG. 1, external data constituted of boundary data of an object is divided into cubic cells by oct-tree division in which boundary surfaces cross each other at right angles, and the divided cells are classified into an internal cell 13a positioned inside and outside of the object and a boundary cell 13b which includes a boundary surface. In the drawing, a reference numeral 15 is a cutting point.

According to this invention, various physical property values are stored for each cell, and substantial data that integrates shapes and physical properties can be stored by a small storage capacity. Thus, a shape, a structure, physical property information, and hysteresis of the object are managed in a unified manner to enable management of data regarding a series of processes from designing to fabricating, assembling, testing, evaluation and the like based on the same data, whereby it is possible to unify CAD and simulation.

Furthermore, the present inventors have invented "Conversion method and conversion program of three-dimensionally shaped data into cell internal data", and filed a patent application [Patent Document 2].

According to the present invention, it is possible to form, from external data, cell internal data capable of dividing a surface very accurately approximated to a curved surface having a large curvature into triangular meshes without forming any triangle having unsatisfactory gap or accuracy, while retaining continuity from an adjacent cell in a volume CAD.

[Patent Document 1]
Japanese Patent Application Laid-Open No. 2002-230054, "Method for storing substantial data that integrates shape and physical properties"

[Patent Document 2]
Japanese Patent Application No. 2001-370040, "Conversion method and conversion program of three-dimensional shape data into cell internal data", not laid open

[Patent Document 3]
Japanese Patent Application Laid-Open No. 2003-44528, "Method of generating surface lattice of object"

[Patent Document 4]
Japanese Patent Application No. 2003-131313, "Method and program for identifying multimedia data", not laid open

[Non-Patent Document 1]

K. Kase, Y. Teshima, S. Usami, H. Ohmori, C. Teodosiu, and A. Makinouchi "Volume CAD" International Workshop on Volume Graphics (VG 03), 2003, Tokyo. Japan.(to appear).

[Non-Patent Document 2]

Y. Teshima, S. Usami, and K. Kase"Shape Approximation, Cube Cutting and Enumeration", The Institute of Statistical Mathematics, Tokyo, Japan,Abstract pp9.

[Non-Patent Document 3]

Y. Teshima, S. Usami, and K. Kase, "Enumeration on Cube Cutting", Japan Conference on Discrete and Computational Geometry , 2002, Tokyo, Japan. pp. 87-88,

[Non-Patent Document 4]

C. M. Hoffmann, "The Problems of accuracy and robustness in geometric computation.", Computer, 22 (3):pp31-41, 1989

[Non-Patent Document 5]

T. Ju, F. Losasso, S. Shaefer, J. Warren, "Dual Contouring of Hermite Data", Siggraph2002, Italy, proc. pp339-346

[Non-Patent Document 6]

W. J. Shroeder, "A Topology Modifying Progressive Decimation Algoritm", Proc. Visuallizatin97, pp205-212, October 1997

[Non-Patent Document 7]

W. J. Shroeder, J. A. Zarge and W. E. Lorensen, "Decimation of Triangle Meshes", Proc. Siggraph 92, pp65-70, July 1992

[Non-Patent Document 8]

K. J. Renze and J. H. Oliver, "Generalized Surface and Volume Decimation for Unstructured Tessellated Domains", Proc. VRAIS96, pp111-121, March 1996

[Non-Patent Document 9]

B. Hamman, "A Data Reduction Scheme for Triangulated Surfaces," CAGD, 11(2)

[Non-Patent Document 10]

I. Navazo, "Extended Octtree Representation of General Solids with Plane Faces: Model Structure and Algorithms", Computer and Graphics Vol. 13, No. 1, pp5-16, 1989

[Non-Patent Document 11]

H. Hoppe, T. DeRose, T. Duchamp, J. McDonald, and W. Stuetzle, "Mesh Optimization", Proc. Siggraph93, pp. 19-26, August 1993

[Non-Patent Document 12]

H. Hoppe, "Progressive Meshes" Proc. Siggraph96 pp99-108, August 1996

[Non-Patent Document 13]

P. Lindstrom and G. Turk, "Evaluation of Memoryless Simplification" IEEE tvcg, 5(2), pp98-115, April-June 1999,

[Non-Patent Document 14]

M. Garland and P. S. HEckbert, "Surface Simplification Using Quadric Error Metrics," Proc. SIGGRAPH 97, pp. 209-216, August 1997.

[Non-Patent Document 15]

C. M. Hoffmann. The problems of accuracy and robustness in geometric computation. Computer, 22(3):31-41, 1989.

[Non-Patent Document 16]

K. Sughihara and M. Iri. A solid modeling system free from topological inconsistency. Journal of Information Processing, 12:380-393, 1989.

[Non-Patent Document 17]

A. Kela. Hierarchical octree approximations for boundary representation-based geometric models, Computer-Aided Design, 21(6):355-362, 1989.

[Non-Patent Document 18]

I. Navazo, D. Ayala and P. Brunet. A geometric modeller based on the exact octtree representation of polyhedra, Computer Graphics Forum (Eurographics '86 Proc.):591-104, 1986.

[Non-Patent Document 19]

W. Lorensen and H. Cline. H. Marching cubes: high resolution 3D surface construction algorithm. ACM Computer Graphics (Proc. of ACM SIGGRAPH '87), 21(4):163-169, 1987.

[Non-Patent Document 20]

I. Navazo, D. Ayala, and P. Brunet "A Geometric Modeller Based on the Exact Octtree Representation of Polyhedra", Computer Graphics Forum 5 pp91-104, 1986

[Non-Patent Document 21]

T. Hama, M. Asakawa, M. Takamura, A. Makinouchi, C. Teodosiu, "A stable and fast new contact search algorithm for FEM simulation of metal forming process", (to appear)

As proposed in [Non-Patent Document 1] and [Patent Document 1], a method for generating shape representation by a cell and a triangle patch adapted to the cell, and data is conducted in the following three steps.

(Step 1) calculation of intersection point between a cell space defined by a user and the triangle patch as an input shape (calculation of cell cutting points)

(Step 2) A closed loop is generated which can be obtained by connecting cell cutting points for each cell on a cell surface. In this case, the loop is determined in order from a loop uniquely determined based on the number of cell cutting points or a relation between the adjacent cell.

(Step 3) The closed loop generated in each cell is divided into triangles based on a difference from the input shape.

However, this method has the following problems.

(1) There is a case where the process of (Step 2) is not completed with respect to a shape which has the same degree of complexity as that of a cell size.

(2) A non-various shape is generated while the shape gradually changes from a shape having a size finer than the cell size to a large shape, and therefore there is a case of failure in the process of (Step 2).

(3) In a case where hierarchizing of the cells is considered, it is remarkably difficult to search for an adjacency relation in the process of (Step 2).

As means for solving these problems, means has been required in which phase information of the triangle patch as the input shape is used as such, and the shape is simplified if necessary.

It is to be noted that a method of dividing the triangle patch into the cell sizes to manage the cells is also proposed in [Patent Document 3]. However, in this method, the triangle patch is not adapted to the cell, and the cell and the triangle patch cannot be managed in one-to-one correspondence. The method cannot be applied to an object of V-CAD which is unified data management from upstream to downstream steps in manufacturing.

Moreover, as to a process in the triangle patch alone, Hoppe [Non-Patent Document 11] or the like has proposed a method of segmentizing/integrating the triangle patches to thereby detail/simplify shape representation [Non-Patent Document 12], and there exist parameters or a dividing method for the sementizing, and various derived systems depending on judgment standards at an integrating time. However, in these methods, there is used a conversion method in which two-various-article conditions and phase conditions of an original shape are taken over as such, and the methods are not suitable for an operation to intentionally simplify micro shapes or the like [Non-Patent Documents 6, 7, and 8].

DISCLOSURE OF THE INVENTION

The present invention has been developed in order to solve the above-described problems. That is, an object of the present invention is to provide a method and a program for generating volume data from boundary representation data, in which phase information of a triangle patch of an input shape is used as such, and the shape can be simplified if necessary in volume CAD.

As a shape representation method of V-CAD [Non-Patent Document 1], means is adopted in which rectangular parallelepiped cells and triangle patches adapted to the respective cells are utilized. The present invention realizes conversion from a triangle patch group used frequently as a three-dimensional shape representation method into a triangle patch group adapted to the cells.

As means for achieving this object, the following two methods have been created:
(1) a method in which triangle patches are segmentized/integrated without changing phases or two-various-article conditions of the original triangle patch group, and adapted to the cells; and
(2) a method in which a phase structure is edited without changing the two-various-article conditions with respect to a structure having a size that is not more than a cell size, and the whole shape is approximately represented.

According to developments of these methods and programs, arbitrary shape data can be adapted to a cell having an arbitrary size, and it is possible to realize a configuration of digital data usable over all steps in manufacturing, including not only designing but also analyzing, manufacturing, reverse engineering and the like.

Moreover, according to the invention of this shape representation method, a set operation in shapes brought into contact with each other can be realized, which has been difficult to realize in CAD described in data of a conventional boundary representation form.

The method and program of the present invention is roughly constituted of the following three steps:
(Step 1) division of a triangle patch having a phase in a cell surface;
(Step 2) integration of vertexes of the triangle patches having the phases except vertexes present on cell ridge lines with the other vertexes; and
(Step 3) setting of adequacy of portions which are contrary to conditions of (Step 2) or conditions (conditions of one ridge line one cutting point) of a data structure of V-CAD by means of approximation processing.

In these steps, information of the cell surfaces utilized in the dividing is imparted to the triangle vertexes during the processing of (Step 1), and utilized in integration processing of (Step 2).

A shape which requires the processing of (Step 3) is classified into the following size types (a, b, c, d1, d2, and d3), and five types of processing and combinations thereof are applied to each type of shape to approximate the shape and set adequacy of the shape:
(a) polyhedrons/triangle patches independent in the cells;
(b) a case where the triangle patches are connected to one another via three or more points including an on-plane point between the adjacent cells;
(c) a case where the triangle patches are connected to one another via three or more points including a point on the same edge between the adjacent cells; and
(d) a case other than (c), wherein two or more cutting points remain on the same cell edge.

Furthermore, the case of (d) can be divided into three patterns (d1, d2, and d3) depending on states of the triangle patches connected to the individual cutting points, and the processing is performed in accordance with each state to erase the points on the edge one by one. As to the finally left case (d3), two triangle groups are regarded as one set to erase the cutting point on the edge. As a result, the processing is continued until the number of the cutting points on the edge is 0 or 1:
(d1) a case where the corresponding cutting point is a boundary between the triangle patches;
(d2) a case where the corresponding cutting point is an inner point of the triangle, and a line is bent in the corresponding position;
(d3) a case where the corresponding cutting point is the inner point of the triangle patch, and crosses the edge;
(A) deletion of the polyhedrons/triangle patches independent in the cell;
(B) division of a fine tube/hole shape;
(C) forcible division of a ridge line at a point distant at a micro distance;
(D) making holes in two plates to connect them in a cylindrical form; and
(E) re-assignment of an attribute of the cutting point.

When the processing is introduced, the following advantages are produced in shape representation of the cell and the triangle patch managed with the cell in the CAD:
(1) The triangle patch can be adapted to the cell having a necessary size without changing two-various-article conditions/phase conditions of surface shape data as an input.
(2) A micro shape having a size that is not more than a designated cell size can be approximated/simplified without changing the two-manifold condition of the input surface shape data.
(3) Since triangle patch data of the input is prepared, an arbitrary shape can be modeled. Processing such as a modifying operation or a set operation (Boolean) can be performed re-using the data of the V-CAD. Especially, the set operation of the shapes brought into contact with each other is processing which has frequently raised problems in existing boundary representation CAD but this processing is realized without any problem.
(4) When several pieces of simple processing are added to the processing with respect to a single class cell, handling of a hierarchized cell can be realized.

[Effect of the Invention]

According to the present invention, it is possible to realize shape representation or physical value representation by the triangle patches adapted to an oct-tree and an octant cell, which has heretofore been difficult in a conventional height. According to development of a method of adapting the cell to the triangle patch, modification processing such as a set operation of shapes represented by the triangle patches can be robustly performed as compared with existing Brep data.

As a result, in a volume CAD, phase information of the triangle patch of an input shape is used as such, the shape can be simplified if necessary, and it is possible to realize a bi-directional link of CAE, CAM or the like with design data by CAD.

Another object and advantageous characteristic of the present invention will be apparent from the following description with reference to the accompanying drawings.

BRIEF DESCRIPTION OF THE DRAWINGS

FIG. 10 is a schematic diagram of a through shape;

FIGS. 11A, B are schematic diagrams of processing of the isolated polyhedron (triangle patch);

FIGS. 12A, B, and cell are schematic diagrams of connected patch processing by means of the points on the plane or the like;

BEST MODE FOR CARRYING OUT THE INVENTION

A preferable embodiment of the present invention will be described hereinafter with reference to the drawings.

In several documents, there has already been proposed a method of representing a shape by use of a voxel, an octant cell, and a triangle patch group adapted to the cells.

In the present invention, there are proposed a method of generating and editing the triangle patch adapted to the cell from boundary representation data (hereinafter referred to as B-rep. data) via a triangle patch having a phase (intermediate-triangle) by means of ridge line division (edge split) in intersection points due to cutting in an infinite plane or ridge line integration (edge-collapse) utilizing index information of the cells, and a volume CAD (hereinafter referred to as V-CAD) as a system for handing such data.

Moreover, since triangles can be managed with the cells in this case, approximation processing of a shape involving edition (disappearance or preparation of holes/deletion of micro shells) of a phase structure is performed in a case where there is a structure (thin hole or rod, thin plate or gap) having a size not more than a cell size.

Basic processing will be described on the basis of the voxel (cell having a single size), and thereafter expansion into the octant cell will be described.

Accordingly, the present invention aims at speeding-up of a geometric operation by strengthening and paralleling, which has heretofore been a problem in a boundary representation CAD using a parametric curved surface or the like, and an object thereof is simulation of structure analysis or thermal fluid analysis using unified data, or direct utilization in comparison with measurement data from a variously worked object having various internal structures.

Figure 1:
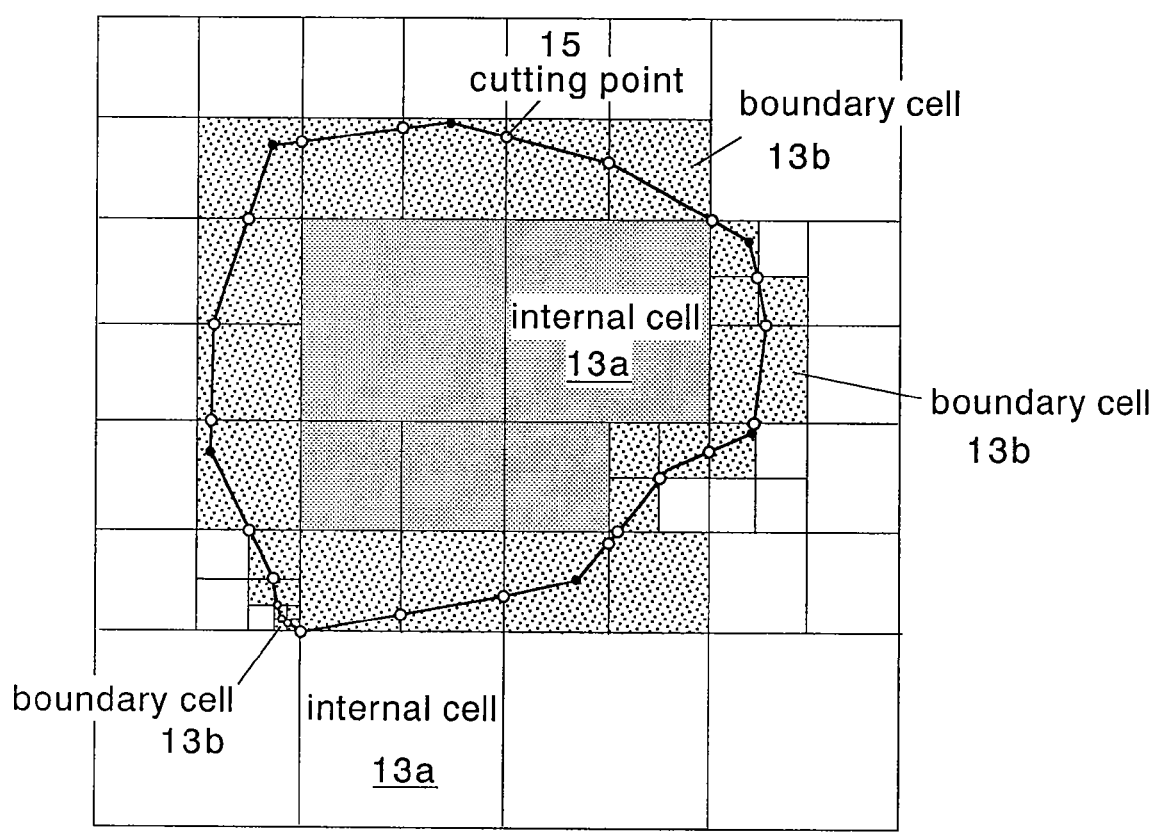
FIG. 1 is a schematic diagram of "Method for storing substantial data that integrates shape and physical properties" of [Patent Document 1]
Figure 2:
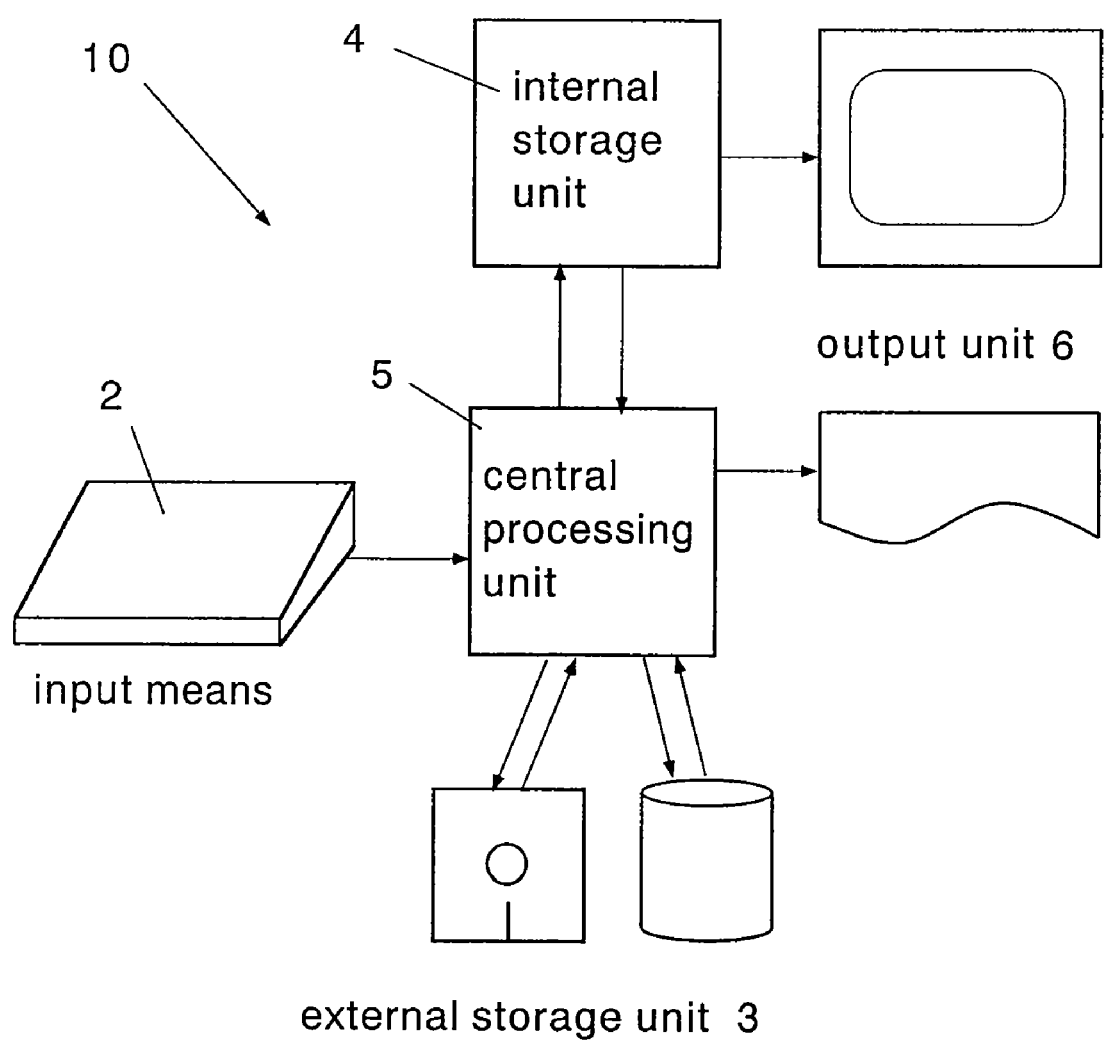
FIG. 2 is a device constitution diagram for executing a method of the present invention.

FIG. 2 is a device constitution diagram for executing a method of the present invention. As shown in the drawing, this device 10 is provided with external data input means 2, an external storage unit 3, an internal storage unit 4, a central processing unit 5, and an output unit 6.

The external data input means 2 is, for example, a keyboard, and inputs external data constituted of boundary representation data of an object. The external storage unit 3 is a hard disk, a floppy disk, a magnetic tape, a compact disc or the like, and stores volume data that integrates a shape and a physical amount and a program for generating the data. The internal storage unit 4 is, for example, RAM, ROM or the like, and stores calculation information. The central processing unit 5 (CPU) processes an operation, input/output or the like in a centralized manner, and executes the program together with the internal storage unit 4. The output unit 6 includes, for example, a display unit and a printer, and outputs stored volume data and an execution result of the program.

The central processing unit 5, the internal storage unit 4, and the external storage unit 3 cooperate to function as data converting means, associating means, dividing/arranging means, ridge line integrating means, state check means, simplifying means, cell assigning means, and labeling means.

The external data input from the outside is polygon data indicating a polyhedron, a tetrahedron or hexahedron element for use in a finite element method, curved surface data for use in three-dimensional CAD or a CG tool, or data in which another solid surface is represented by information containing a partial plane or curved surface.

In addition to such data (referred to as S-CAD data), the external data may be (1) data directly prepared by a human input through an interface of V-CAD's own (V-interface), (2) surface digitized data of a measuring device, a sensor, a digitizer or the like, and (3) volume data containing internal information such as voxel data for CT scanning, MRI, and generally used for volume rendering.

1. Introduction

The data of solid CAD or surface CAD (hereinafter referred to generically as the S-CAD) which has heretofore handled the boundary representation data (B-rep. data) can represent various shapes with a very small data size, but reusability of the data largely drops owing to accuracy or the like in a boundary position of the plane, and close attention has to be paid in operating the data [Non-Patent Document 15] [Non-Patent Document 16].

Moreover, in the CAE or CAM, instability of the processing attributable to numerical value errors, or a processing time by convergence calculation is avoided, and data is converted into the triangle patch or the voxel for use in many cases in the present situations.

Moreover, especially for a purpose of speeding up a geometric operation such as a set operation, there are a solid modeler [Non-Patent Document 17] using an octree, and a research [Non-Patent Document 18] of an extended octree, in which an octant cell is associated with a polyhedron. However, there is not any mechanism that simplifies a structure smaller than the cell beyond a phase or that maintains two-various-article conditions without any gap even in a case where there is a hierarchical difference between the adjacent cells in the octree for a purpose of inhibiting the structure in subsequent analysis or working as in the present invention.

In the present invention, there is provided Kitta Cube [Non-Patent Document 1], [Non-Patent Document 2], or [Non-Patent Document 3] which is a data structure of a volume CAD constituted of a hierarchized cell such as a voxel or an octant cell, and a triangle group in the cell. Accordingly, there is proposed a method in which accuracy or size of a triangle patch for use in a subsequent step is controlled, and there are constructed a data structure usable in not only designing but also reverse engineering including analysis, manufacturing, and internal structure, and Kitta Cube while retaining phase conditions by a basic operation with respect to the triangle patch having a phase.

Furthermore, when Kitta Cube is utilized, the set operation or the like can be performed only by local operation processing of a cell unit. Therefore, the set operation [Non-Patent Document 4] of the shapes brought into contact with each other is also easily realized, which has been difficult to realize in S-CAD that handles the B-rep. data. It is to be noted that in the present invention, the volume data means Kitta Cube which is the data structure of the volume CAD.

2. Background

As a method of shape representation, a method utilizing the triangle patch is utilized in broad fields of CG, CAE, CAM, reverse engineering and the like in respect of convenience of the data structure, and convenience/processing speed of calculation processing [Non-Patent Documents 7, 12 and 19]. In addition, in a case where local calculation such as contact judgment when utilized in the CAE or the CAM is frequently used, a method of managing a triangle floating in a space by use of the voxel or the like is also frequently used [Non-Patent Documents 10, 20 and 21].

In the V-CAD, the octant cell and the triangle patch managed by each cell are used in shape representation [Non-Patent Documents 1, 2 and 3]. Furthermore, a position of a vertex constituting the triangle patch (the triangle managed by Kitta Cube will be described hereinafter as the "cut triangle") is limited to the vertex of each cell or the position on a ridge line. The number of the vertexes on the ridge line is limited to one at most to thereby simplify the data structure and processing.

Such data structure has a merit that the accuracy or size of the triangle patch can be controlled. On the other hand, processing with respect to a shape having a size that is smaller than the cell size is a problem. There is a marching cube (hereinafter referred to as MC) method [Non-Patent Document 19] as one of solving means, and the triangle using Kitta Cube is investigated as a method capable of more directly handling information of a broader representational power [Non-Patent Document 1] and S-CAD.

3. Prior Art 3.1 Data Structure of V-CAD

Figure 3:
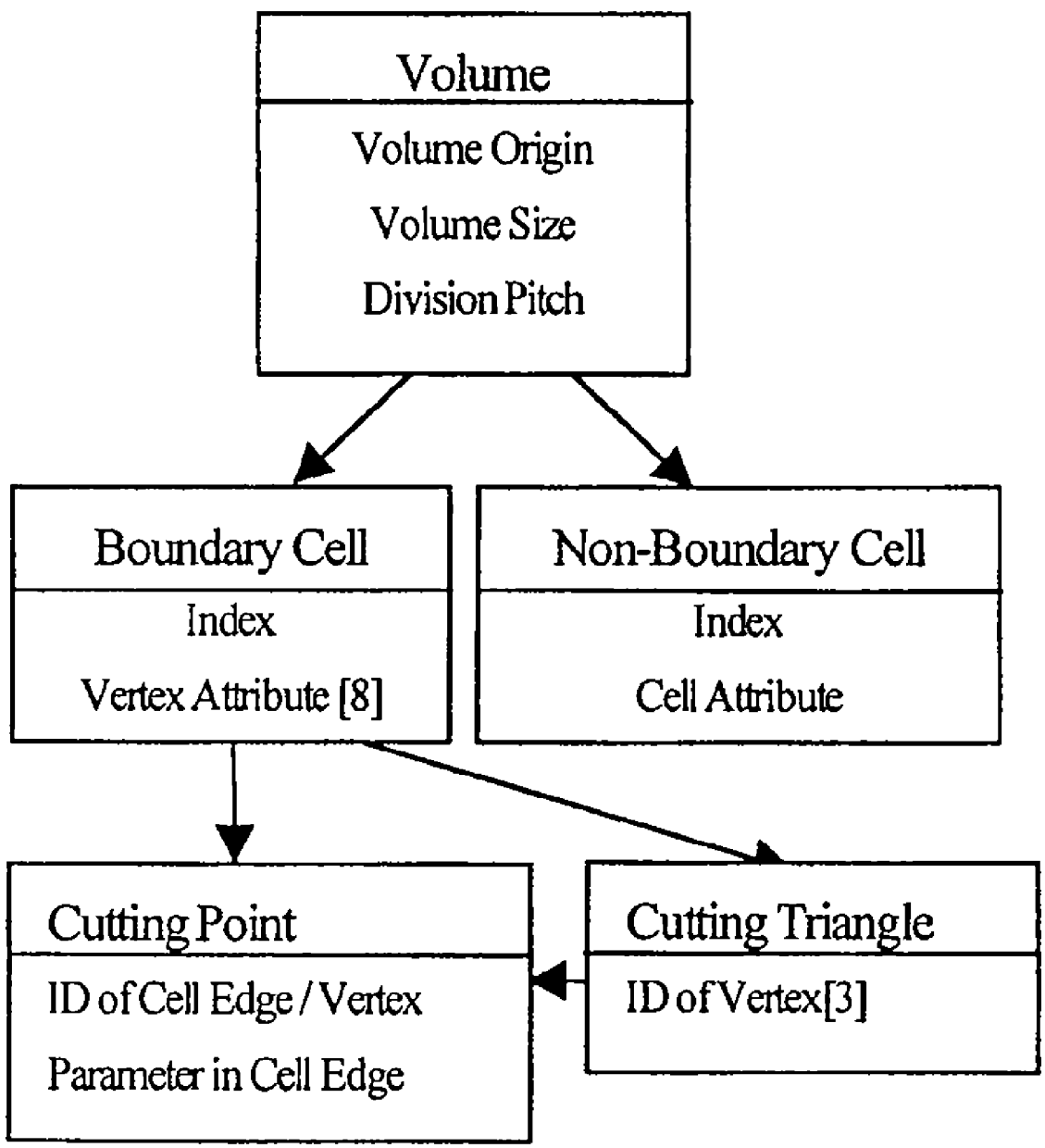
FIG. 3 is a data structure diagram of volume data.

The V-CAD data proposed by the volume CAD [Non-Patent Document 1] by Kase et al. is focused on management of the triangle patch by the voxel. The data structure is shown in FIG. 3, and a target of the method of the present invention is this data structure.

This data structure has two types: a boundary cell as a cell which manages the triangle patch; and a nonboundary cell which is not related to the triangle patch. The boundary cell retains one medium value for each vertex, and the nonboundary cell retains one medium value for each cell.

3.2 Preceding Method and Program of V-CAD

A method of generating the data of the V-CAD is performed in the following steps.

(1) Step 1 Calculation of Cutting Point

An intersection point of a tessellated triangle patch and a ridge line of a cell is calculated to obtain a cutting point. In this case, one representative point is integrated in a case where a plurality of intersection points are obtained on a cell edge.

(2) Step 2 Determining of Loop and Setting of Cut Triangle

From arrangement of the cutting points of each cell, boundary loops of the cut triangles in the cell are determined in order by use of a phase relation between the adjacent cells, and the cut triangles are set in comparison with a geometric shape.

(3) Step 3 Internal/External Judgment of Cell

First, internal/external judgment of the nonboundary cell is performed. Subsequently, the internal/external judgment of the boundary cell is performed. In the internal/external judgment of the nonboundary cell, an initial value is given to an arbitrary cell, and additionally adjacent nonboundary cells have an equal medium value. In the internal/external judgment of the boundary cell, the medium value of the nonboundary cell is set to the vertex shared with the nonboundary cell. As to the vertex that is not obtained, a cell ridge line that does not include any cutting point, and a diagonal line of a cell that does not intersect with the cut triangle are tracked to add a known medium value. It is to be noted that in a case where the cutting point exists on the cell vertex, a medium value having a larger azimuthal angle occupied by the medium value in the corresponding cell is adopted.

Through these steps 1 to 3, it is possible to form Kitta Cube with respect to a variety of shapes, and appropriate conversion is possible even with respect to an input of low-quality S-CAD data. On the other hand, it has been difficult to appropriately approximate the structure having a size smaller than the cell size. In the method of the present invention, processing in this respect, and easily handled processing with respect to an octree structure were investigated.

Therefore, as introduced in the present invention, there was developed a method of adapting the triangle patch having the phase to the cell by edge-split processing and edge-collapse processing proposed as simplifying and inverse operations to retain a phase by Hoppe [Non-Patent Documents 11 and 12], Shroeder [Non-Patent Document 7], Renze [Non-Patent Document 8], Hamman [Non-Patent Document 9] and the like. There has been newly developed a method of correcting a phase structure (preparation/extinction of holes, separation/integration of shells) while retaining two-various-article properties of the triangle patch for a purpose of approximately representing the structure which is smaller than the cell size in such a manner as to use structure as such in subsequent-flow simulation or working.

Remeshing to change a phase of the triangle patch is proposed by Ju [Non-Patent Document 5] or Shroeder [Non-Patent Document 6], but Ju method cannot be directly used for the purpose because it is necessary to prepare Hermite data, and Shroeder method cannot be directly used for the purpose because simplification of the triangle is advanced by the extinction of rings (or loops) in Euler operation, and the method is not suitable for removal of small holes.

4. Method and Program of the Present Invention

A summary of the method of the present invention will be described in "outline", details of steps will be described in 4.2 to 4.4, a summary of a set operation (Boolean) utilizing the present method will be described in 4.5, and changes in extending an octree will be described in 4.6.

4.1 Outline and Intermediate Data

An intermediate triangle having a phase is utilized as intermediate data while V-CAD data is generated from S-CAD data. An intermediate vertex having the phase is constituted of data of a hierarchical structure of an intermediate edge having the phase/intermediate vertex having the phase. The intermediate vertex having the phase retains, as attribute values, index data (Index) of the cell including the vertex and a type of vertex (in the cell (BODY), cell face (FACE_YZ, FACE_ZX, FACE_XY), cell edge (EDGE_X, EDGE_Y, EDGE_Z), and vertex (VERTEX)).

An intersection point of an infinite plane including the cell face and the intermediate ridge line having the phase is calculated utilizing this data structure, the intermediate triangle having the phase is segmentized, and the ridge line is integrated in accordance with the ridge line of the cell to thereby adapt the intermediate triangle having the phase to the cell.

Figure 4:
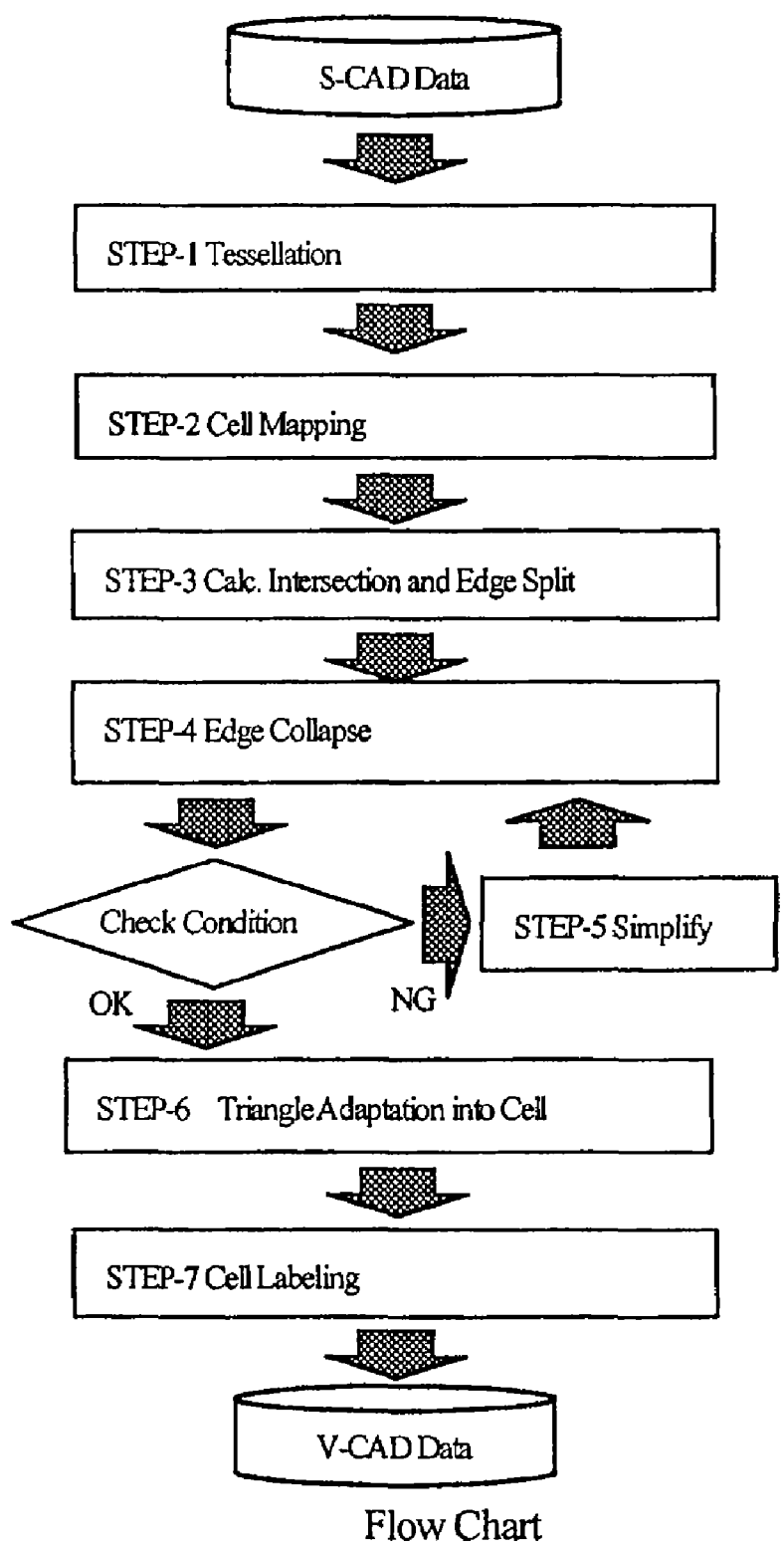
FIG. 4 is a flowchart of the method of the present invention.

A flowchart of the method of the present invention is shown in FIG. 4. Among steps, the summary of the processing and general processing steps will be described here. In the drawing, S-CAD data, that is, boundary representation data is input beforehand into the external storage unit 3 or the internal storage unit 4 of a computer by the external data input means 2 in Step 1.

(1) Step 1: Tessellation (Data Conversion)

The central processing unit 5, the internal storage unit 4, and the external storage unit 3 cooperate to perform a data converting step by data converting means. That is, in Step 1, B-rep. data is solidified (merge of a boundary line of a plane), and a surface shape is converted into the triangle patch having the phase based on the data. In this case, when accuracy of the original B-rep. data is bad, and the solidifying cannot be performed well, phases cannot be connected well at the time of the conversion into the triangle patch having the phase, and there exists a case where holes are made in the triangle patch, but in this case, the holes are filled by dividing, into triangles, a polygon of a portion having a gap with a diameter which is not more than a designated threshold value.

(2) Step 2: Cell Mapping (Associating)

The central processing unit 5, the internal storage unit 4, and the external storage unit 3 cooperate to perform an associating step by associating means. That is, in Step 2, associating of the cell with the triangle to be included in the cell is performed beforehand using a rectangular parallelepiped member (Bounding Box) along a coordinate axis circumscribed on the triangle in order to speed up the calculation of the cutting point by means of the cell face.

(3) Step 3: Calculation of Intersection Point and Division of Ridge Line (Dividing/Arranging)

The central processing unit 5, the internal storage unit 4, and the external storage unit 3 cooperate to perform the dividing/arranging step by dividing/arranging means.

(4) Step 4: Ridge Line Integrating

The central processing unit 5, the internal storage unit 4, and the external storage unit 3 cooperate to perform a ridge line integrating step by ridge line integrating means.

(5) State Check Step

The central processing unit 5, the internal storage unit 4, and the external storage unit 3 cooperate to perform a state check step by state check means. In this step, it is judged whether or not the following items are satisfied at the end of the ridge line integrating (edge collapse) in Kitta Cube in order to manage both of a data amount and a processing time (edge-base point management):

a) there is not any triangle vertex in a cell body or on a cell surface;

b) there is only one vertex of the triangle patch on the cell edge; and c) a phenomenon does not occur in which the phase changes by integrating the cutting points.

In a case where the vertex that does not satisfy these conditions is found, and a shape around the vertex is approximated by a method of 4.4 to obtain a shape which can be represented by the triangle patch in the cell.

(6) Step 5: Simplify

The central processing unit 5, the internal storage unit 4, and the external storage unit 3 cooperate to perform a simplifying step by simplifying means.

(7) Step 6: Adapting of Triangle to Cell (Cell Assigning)

The central processing unit 5, the internal storage unit 4, and the external storage unit 3 cooperate to perform a cell assigning step by cell assigning means. That is, in Step 6, each triangle and the vertex are assigned to the cell with reference to index data of the vertex. Here, the data structure of Kitta Cube shown in FIG. 3 is generated.

(8) Step 7: Internal/External Judgment of Cell (Labeling)

The central processing unit 5, the internal storage unit 4, and the external storage unit 3 cooperate to perform a labeling step by labeling means. That is, in Step 7, attribute values of the cell are set utilizing an adjacency relation between the cells. In this step 7, a method described in [Patent Document 4] is applied. That is, the method has a space dividing step (D) of dividing each vertex of each cell into a plurality of spaces partitioned by boundary data. This space dividing step (D) includes: a nonboundary cell setting step (D1) of setting, to all nonboundary cells, space numbers which differ with each of the spaces partitioned by the boundary data; and a boundary cell setting step of setting each vertex of the boundary cell to the space number of the adjacent nonboundary cell which is not partitioned by the boundary data. In the boundary cell setting step (D2), the vertex which agrees with the boundary data is set to either of the space numbers of two adjacent nonboundary cells. Furthermore, the nonboundary cell setting step (D1) is repeated in order with respect to three directions of X, Y, and Z, or all rectangular parallelepiped cells are scanned in order by recursive processing.

The data which sets the attribute value of the cell in the step 7 is output as V-CAD data (volume data) to the external storage unit 3 and the output unit 6.

4.2 Calculation of Intersection Point and Ridge Line Division (Edge Split)

A purpose is to divide the triangle patch having the phase, floating in the space, by cell faces, and arrange all triangles in the cell and on the boundary.

First, as initialization of the existing intermediate vertex having the phase, the attribute values of BODY to VERTEX, and index data of the included cells from the coordinate value are added depending on whether or not each vertex exists on any plane.

Thereafter, the intersection point of the intermediate ridge line having the phase and the plane including the cell face is calculated utilizing cell mapping information and phase information of the intermediate triangle having the phase, the intersection point is registered as a new intermediate vertex having the phase, and the attribute value and the index data of the cell to which the point belongs as described in 4.1 are added in order.

4.3 Ridge Line Integrating (Edge Collapse)

In this step, the ridge line is integrated without changing the phase as described in [Non-Patent Documents 7, 8, 9, 11 and 12] and the like. In addition to retention of the phase, the following items are added as conditions capable of integrating the ridge lines in order to limit the vertex of the triangle on the edge of the cell or the cell vertex:

(1) an in-body point is integrated with a point having an arbitrary attribute value;
(2) an on-plane point is integrated with the on-plane point, an on-edge point, or a cell vertex;
(3) the on-edge point is left as such or integrated with the on-edge point or the cell vertex;
(4) the cell vertex is left as such or integrated with the cell vertex; and
(5) the points are integrated with the only points in the same cell during the integrating on the above-described conditions.

These conditions are shown in Tables 1 and 2.

In a case where there exist a plurality of intermediate vertexes having adjacent phases corresponding to the above-described conditions which can be integrated, priorities are set in order from a small volume change by means of a value of Quadric Error Metric (QEM) described in [Non-Patent Document 14] or the like, and the ridge lines are integrated in a form close to an original geometric shape.

4.4 State Check

It is confirmed whether or not the triangle groups decreased as a result of the ridge line integration satisfy the following conditions:

(1) any on-plane point/in-body point is not left; and
(2) any point whose attribute value is equal to that of the index data is not left.

Figure 5:
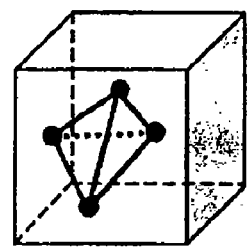
FIG. 5 is a schematic diagram of an isolated polyhedron.
Figure 6:
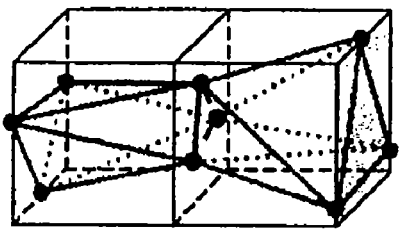
FIG. 6 is a schematic diagram of connection of points on a plane.

When these conditions are analyzed in more detail, the following conditions exist:

(a) an isolated polyhedron/triangle patch independent in the cell (FIG. 5);
(b) an on-plane point connection case where the triangle patches are connected to one another via three or more points including the on-plane point between the adjacent cells (FIG. 6);
(c) an on-the-same-edge connection case where the triangle patches are connected to one another via three or more points including the point on the same edge between the adjacent cells (FIG. 7); and
(d) a case other than (c), wherein two or more intermediate vertexes having the phase are left on the same cell edge.

Further in the case of (d), as to the finally left case (d3) where a pattern can be divided into three patterns depending on states of the triangle patches connected to individual intermediate vertexes having the phases, and processed

TABLE 1

| $t_1$ | $t_2$ | | | | | | | |
|---|---|---|---|---|---|---|---|---|
| | BODY | FACE_YZ | FACE_ZX | FACE_XY | EDGE_X | EDGE_Y | EDGE_Z | VERTEX |
| BODY | 1 | 0 | 0 | 0 | 0 | 0 | 0 | 0 |
| FACE_YZ | 1 | 2 | 0 | 0 | 0 | 0 | 0 | 0 |
| FACE_ZX | 1 | 0 | 3 | 0 | 0 | 0 | 0 | 0 |
| FACE_XY | 1 | 0 | 0 | 4 | 0 | 0 | 0 | 0 |
| EDGE_X | 1 | 0 | 3 | 4 | 5 | 0 | 0 | 0 |
| EDGE_Y | 1 | 2 | 0 | 4 | 0 | 6 | 0 | 0 |
| EDGE_Z | 1 | 2 | 3 | 0 | 0 | 0 | 7 | 0 |

A value obtained by disposing an attribute value t1 in the ordinate of the table and disposing an attribute value t2 on the abscissa is regarded as a flag. When the conditions present in the following table are satisfied, the attribute value t2 is integrated toward the attribute value t1.

TABLE 2

Merge Conditions (2) of Intermediate Vertex

| flag | collapse Conditions on which collapse is possible |
|---|---|
| 0 | Impossible |
| 1 | Possible without any condition |
| 2 | x1 == x2 |
| 3 | y1 == y2 |
| 4 | z1 == z2 |
| 5 | y1 == y2 and z1 == z2 |
| 6 | z1 == z2 and x1 == x2 |
| 7 | x1 == x2 and y1 == y2 |
| 8 | x1 == x2 and y1 == y2 and z1 == z2 | depending on the respective states to thereby erase the points on the edge one by one, two triangle groups are regarded as one set, and the intermediate vertexes having the phases on the edge are erased. As a result, the processing is continued until 0 or 1 intermediate vertex having the phase on the edge is left.

Figure 8:
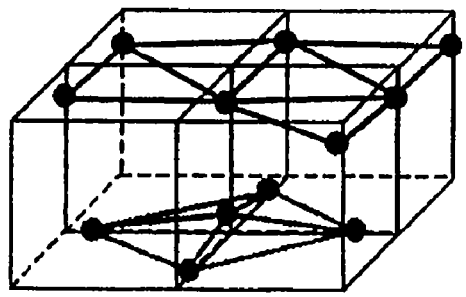
FIG. 8 is a schematic diagram of boundary points.
Figure 9:
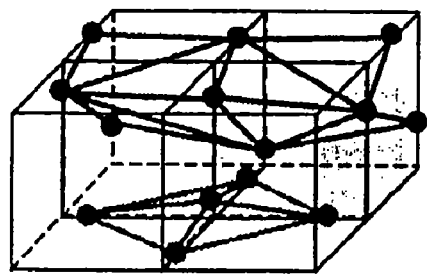
FIG. 9 is a schematic diagram of a bent shape.

(d1) a boundary point case where the corresponding intermediate vertex having the phase is a boundary of the triangle patch (FIG. 8);
(d2) a bent shape case where the corresponding intermediate vertex having the phase is an internal point of the triangle, and a side is bent in the corresponding position (FIG. 9); and
(d3) a through shape case where the corresponding intermediate vertex having the phase is an internal point of the triangle patch, and crosses the edge (FIG. 10).

The processing in the simplifying step is branched depending on each case.

4.5 Simplification

The approximation of a shape is performed by the following five types of operations and a combination thereof.

(1) Deletion of Polyhedron/Triangle Patch Independent in Cell

A constitution in which the triangles formed by the intermediate vertexes having the same index data and having the phases constitute a polyhedron (according to Hoppe rule, a tetrahedron is basically constituted, but integration from the on-plane point to a point on another plane cannot be performed, and therefore another polyhedron is also considered in the present method) is searched from a constitution in which all sides of the triangles are shared by the triangles in the cell.

Moreover, the polyhedron floating alone is searched for by finding a triangle group whose sides are not shared by the triangles of another cell.

All the triangles and intermediate vertexes having the phases, belonging to the polyhedron or polygon found in this manner, are deleted.

(2) Division of Thin Cylinder/Hole Shape

Figure 7:
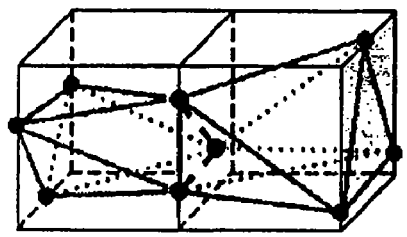
FIG. 7 is a schematic diagram of connection of points on the same edge.

In a case where there is a thin cylindrical shape or a hole shape as shown in FIG. 6 or 7, when ridge lines are integrated on conditions shown in Tables 1 and 2, a situation occurs in which a phase structure changes against Hoppe conditions.

When such case occurs, the shape is divided at the boundary that is the triangle constituted of three points (i.e., three points on the plane in the drawing, but all the points are sometimes on the cell edge) constituted of two points which have failed in the ridge line integration and one arbitrary point adjacent to the two points), and three open sides on opposite sides are closed by the respective triangles. In this case, the vertexes of the divided triangles are duplicated and handled as separate elements.

(3) Forced Ridge Line Division at Point Distant at Micro Distance (Edge Split)

The division is performed as preprocessing with respect to a case where there are a plurality of vertexes on the cell ridge line as shown in FIGS. 13 to 15. The sides of the triangles connected to the intermediate vertexes as objects are listed up, the intermediate vertex having the phase is prepared in a position distant at a micro distance, and the ridge line is divided at this point.

(4) Holes are Made in Two Plates to Connect the Plates to each other in a Cylindrical Form.

This is performed on an assumption that it is performed continuously from the processing of (3). Therefore, as to two points on the cell edge as the object, it is assumed that the ridge line is already divided at points in the vicinity.

Two points on the cell edge as the object and the triangle utilizing the points are deleted. Accordingly, small holes are generated around the cell edge.

Subsequently, a cylindrical triangle patch is generated between the holes of two plates. In this case, when the processing is performed for each cell, the triangle patch is constituted without any self interference (FIG. 15).

(5) Change of Attribute Value

After performing each type of approximation processing, the point present on the cell edge or the cell surface is changed to the on-plane point or the in-body point in order to perform the ridge line integration again. In this case, when the point is changed to the on-plane point, ID and index data of the plane are set with reference to the index data of a direction (adjacent vertexes) to be integrated in the next step.

Each processing will be described hereinafter corresponding to state check items.

(a) Processing of isolated polyhedron (triangle patch) Processing (1): FIG. 11A→FIG. 11B (b) Connection of adjacent cells (processing of connected patch via on-plane point or the like)
Processing (5) after (2): FIG. 12A→FIG. 12B→FIG. 12C (c) Connection (2) of adjacent cells
Processing (5) after (2)

Figure 13A:
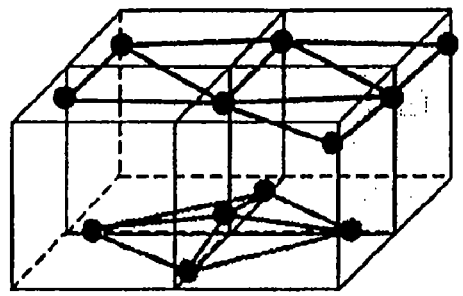
FIGS. 13A, B, and C are schematic diagrams of boundary point processing of a plurality of cutting points on one edge.
Figure 13B:
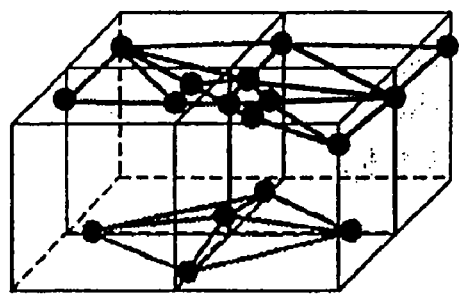
Figure 13C:
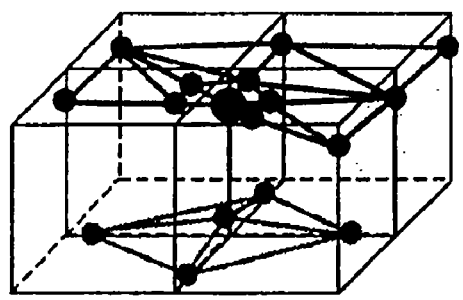
Figure 14A:
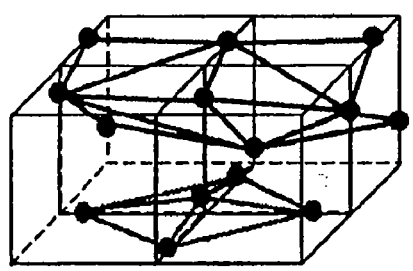
FIGS. 14A, B, and C are schematic diagrams of bending point processing of a plurality of cutting points on one edge.
Figure 14B:
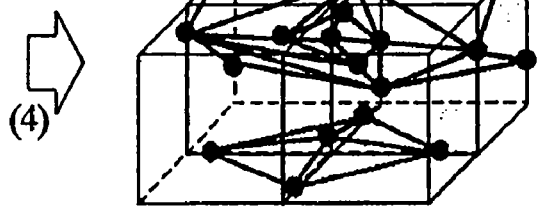
Figure 14C:
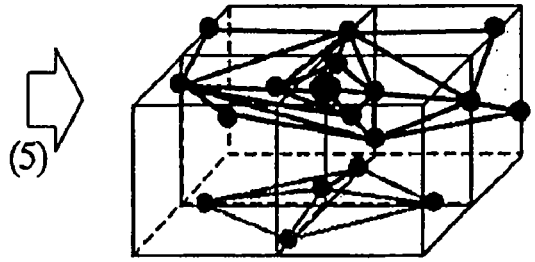
Figure 15A:
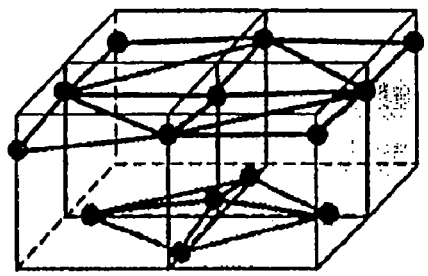
FIGS. 15A, B, C, and D are schematic diagrams of processing of two through planes of the plurality of cutting points on one edge.
Figure 15B:
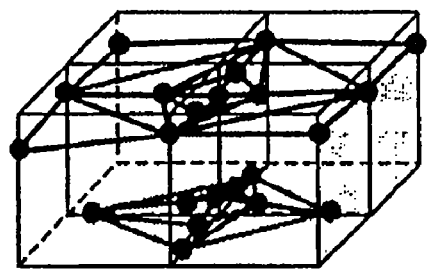
Figure 15C:
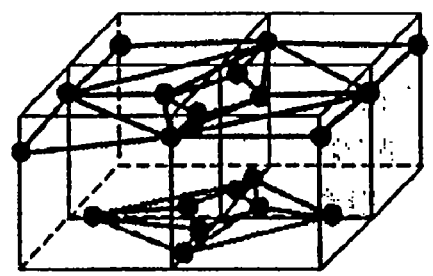
Figure 15D:
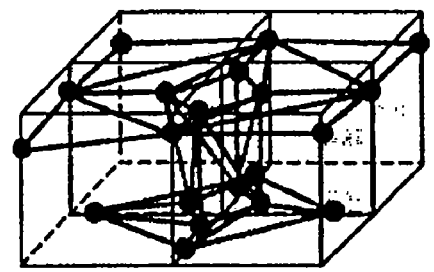

(d1) Triangle patch boundary (processing (1) of one edge plurality of cutting points, boundary point)
Processing (5) after (3): FIG. 13A→FIG. 13B→FIG. 13C (d2) Bend of triangle patch (processing (2) of one edge plurality of cutting points, bending point)
Processing (5) after (3): FIG. 14A→FIG. 14B→FIG. 14C (d3) Passing of triangle patch (processing (3) of one edge plurality of cutting points, two through planes)
Processing (4) after (3): FIG. 15A→FIG. 15B→FIG. 15C→FIG. 15D In a case where the on-plane point/in-body point remains, or processing is executed to add the on-plane point or the in-body point after performing the above-described processing, the processing returns to the processing of ridge line integration.

4.6 Set Operation (Boolean)

If the cell and the triangle patch having the phase are prepared utilizing the present method, a cell inner surface can be freely constituted. Since the triangle constituting the boundary is managed with the cell, shape calculation processing such as set operation processing is possible only by repeating local operation for each cell or only with reference to one adjacent vicinity as pointed out by Kela [Non-Patent Document 17].

Furthermore, for example, the set operation is possible in the following steps, and much more robust calculation is possible as compared with the set operation of S-CAD utilizing NURBS curved surface.

(1) Step 1: Operation of Nonboundary Cells

It can be judged whether or not a medium as a target is included. This is the same processing as Boolean of a usual voxel.

(2) Step 2: Operation of Nonboundary Cell to Boundary Cell

The processing is branched, but information of either cell is taken over as such or only by reversing the boundary surface depending on a type of operation or the boundary cell. A correspondence table is shown in Table 3. In the table, Base indicates the cell on a reference side of Boolean operation, and Tool indicates a cell to be added or subtracted (in actual, a difference between Base and Tool is related only at the time of subtraction. In this case, it is supposed that Object=Base−Tool). As to characters of a processing column, Inside: inside the shape as a target, Outside: outside the shape as the target, and Boundary: boundary of the shape as the target. The information of the boundary cell of either Base or Tool is taken over as such. Moreover, (Negative) indicates that the inner surface of the boundary cell is reversed and taken over.

TABLE 3

Boolean Operation(1)

| | Base | Tool | Processing |
|---|---|---|---|
| Union | Boundary | Inside | Inside |
| | Boundary | Outside | Boundary |
| | Inside | Boundary | Inside |
| | Outside | Boundary | Boundary |
| Subtraction | Boundary | Inside | Outside |
| | Boundary | Outside | Boundary |
| | Inside | Boundary | Boundary (Negative) |
| | Outside | Boundary | Outside |
| Intersection | Boundary | Inside | Boundary |
| | Boundary | Outside | Outside |
| | Inside | Boundary | Boundary |
| | Outside | Boundary | Outside |

Information in which the triangle of the boundary is taken over is connected in order from the information processed in this manner.

(3) Step 3 Boundary Cell to Boundary Cell

Here, the triangles intersect/coexist/overlap with each other in the same cell area. The following processing is performed in order to edit the shape into a targeted shape.

(S1) Intersection between the triangles is calculated, and the ridge line division is performed to obtain a state in which an intersection line portion of the triangle patch is divided into the triangles.

(S2) The triangle present in an unnecessary area is deleted from both of the triangles (Table 4).

TABLE 4

Boolean Operation (2)

| | Point/triangle to be deleted | |
|---|---|---|
| | Base | Tool |
| Union | Inside Tool | Inside Base |
| Subtraction | Inside Tool | Outside Base |
| Intersection | Outside Tool | Outside Tool |

(S3) The triangles are merged. In this case, the boundary surface of the cell on a tool side of a subtraction operation is turned over and merged.

(S4) In a case where the triangles exist on the same plane, the processing is performed as follows depending on a front/back direction of the triangle.

(a) Same direction: one of two agreeing surfaces is left.

(b) Opposite direction: both of two agreeing surfaces are deleted.

(S5) The merged triangle patches are connected in order to the triangle patch having the phase.

(4) Step 4

The ridge line integration processing and subsequent processing are performed based on the triangles connected in this manner to thereby end the set operation.

4.7 Extension to Octree

The investigation has been advanced up to now on an assumption of a homogeneous rectangular parallelepiped cell. However, even in a case where the cell is converted into the octree, when some changes are added, the adapting to the cell can be simply performed by the similar processing.

Figure 16:
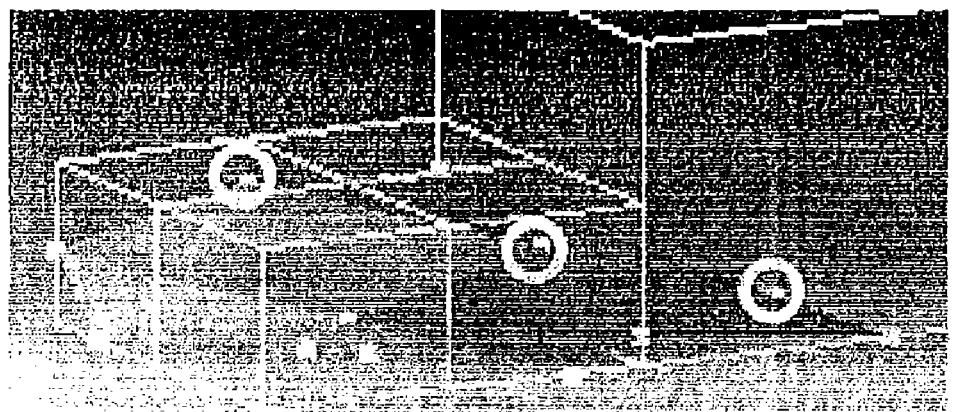
FIG. 16 is a schematic diagram of the cutting points on the plane.

The changes will be described hereinafter:

(1) In a case where a hierarchical difference exists between the adjacent boundary cells, a larger cell is used as a "connecting cell", and relaxes the following conditions: the on-plane point is allowed on the shared surface; and two or more cutting points are allowed on the shared ridge line (FIG. 16).

(2) In the ridge line division, a cut plane group is prepared in accordance with the finest cell, and it is determined whether or not actual intersection point calculation is right/wrong by presence of a cell whose surfaces are utilized as cell surfaces.

(3) At the time of the ridge line integration, a type of intermediate vertex having the phase is reassigned anew depending on a size of the cell in the corresponding position. At this time, the index data does not have to be changed.

(4) In a case where the internal/external judgment of the cell cannot be performed between the vertexes connected to each other via the cell edge during the internal/external judgment of the cell, since there are more vertexes having opposing angles/plane opposing angles in the connecting cell than in a single hierarchy cell, the searching of the adjacency relation is changed.

According to the above-described change, handling of the hierarchized cells of the V-CAD data is realized.

5. Conclusion

The V-CAD data prepared by performing the processing is attached in FIGS. 17A to 17F, FIG. 18A, and FIG. 18B.

Figure 17A:
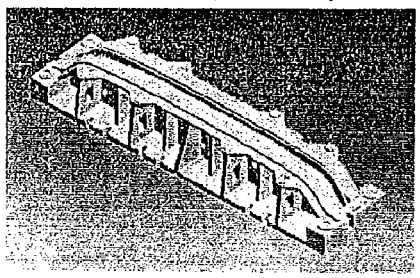
FIGS. 17A to F are diagrams showing an actual industrial product shape (mold component of a car bumper)
Figure 17B:
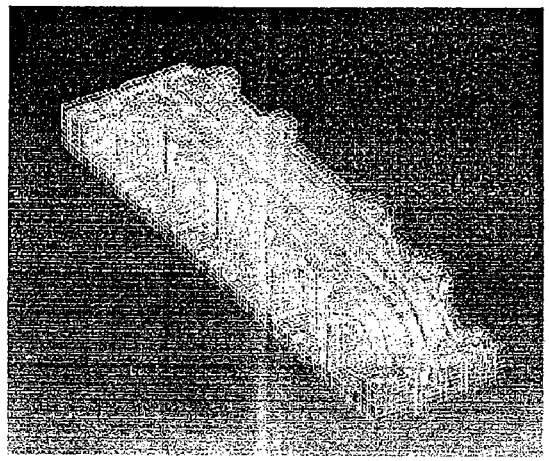
Figure 17C:
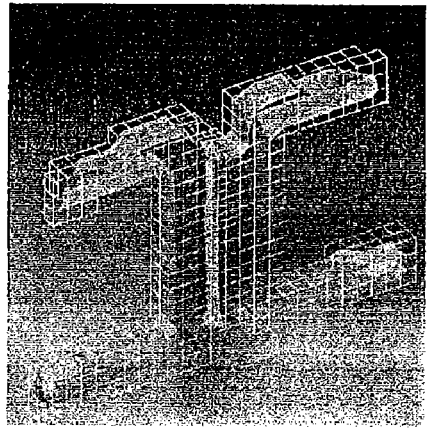
Figure 17D:
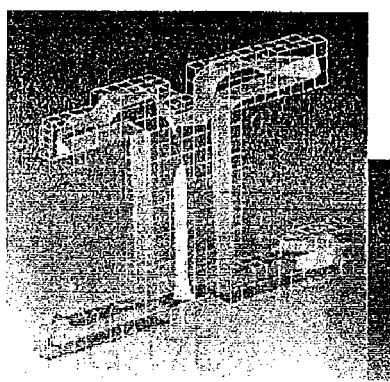
Figure 17E:
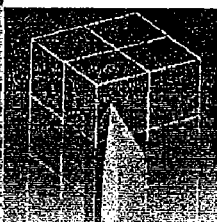
Figure 17F:
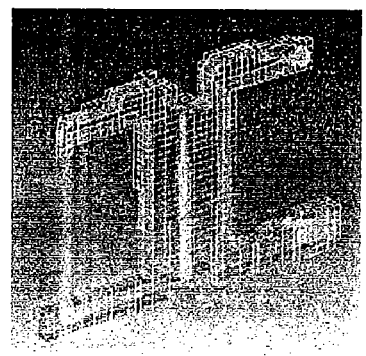

FIGS. 17A to 17F show shapes of actual industrial products (mold components of car bumpers). When a portion having a hole shape that is smaller than the cell size (FIG. 17C) is extracted, it is possible to reduce the cell size by one stage (FIG. 17F) in order to simplify the shape as described in 4.5 or represent this hole by Kitta Cube as in FIG. 17D of a lower stage. However, in this case, when only necessary cells are hierarchized in consideration of an increase of a data amount as shown in FIG. 17E, it is possible to perform required shape representation while reducing a data size. It is to be noted that conversion/inversion between the shape representations is also possible.

Figure 18A:
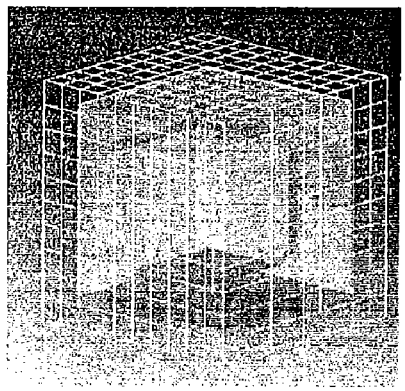
FIGS. 18A, B are diagrams showing results of a set operation of simple shapes.
Figure 18B:
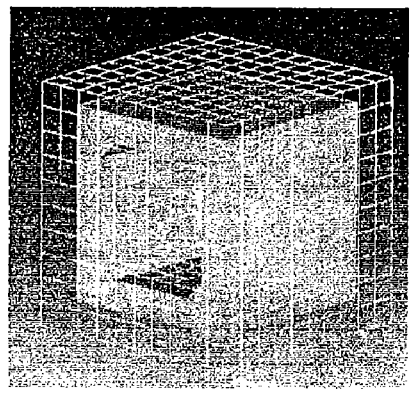

Moreover, as to a result of the set operation, operation results of simple shapes are depicted in FIGS. 18A and 18B. FIG. 18A shows an original result, and FIG. 18B shows the result after subtraction. Here, two inscribed rectangular parallelepiped members are subjected to subtraction, and the set operation in a state in which two shapes are brought into contact with each other fails in the existing S-CAD in considerable cases. Therefore, in a standard (Product Design Quality) of CAD data preparation in each country, it is recommended that the set operation be performed in a state in which shapes surely clearly intersect with each other as "modeling sub-branches". On the other hand, since the shape is constituted to be discrete, and managed with the cell by use of Kitta Cube, the set operation of the shapes brought into contact with each other is also easily realized.

The invention has been described by way of preferred embodiments. However, it can be understood that a scope of claims of the invention is not limited to the embodiments. As a matter of fact, all kinds of improvements, modifications and equivalents are within the scope of the appended claims of the invention.

The invention claimed is:

1. A method of generating volume data from boundary representation data, comprising the steps of:

(A) inputting boundary representation data of an object having a surface shape into a computer via external data input means, wherein the boundary representation data inputted comprises three dimensionally shaped data;
(B) converting the boundary representation data so that the boundary representation data is solidified or merged of a boundary line of a plane and converting surface shape into a triangle patch having a phase by data converting means;
(C) dividing a space into rectangular parallelepiped cells whose boundary planes cross one another at right angles to associate each cell with a triangle to be included in the associated cell by associating means;
(D) dividing the triangle patch having the phase, floating in a space, by cell faces to bring a state in which all the triangles are arranged inside associated cells and on a boundary by dividing/arranging means;
(E) integrating ridge lines by ridge line integrating means without changing the phase, and judging whether or not the following conditions are satisfied
  i. there is not any triangle vertex in a cell body or on a cell surface;
  ii. there is only one vertex of the triangle patch on the cell edge; and
  iii. a phenomenon does not occur in which the phase changes by integrating the cutting points;
(F) assigning each triangle and a vertex of the triangle to the associated cell with reference to index data of the vertex by cell assigning means; and
(G) setting an attribute value of each cell by labeling means.

2. The method of generating volume data from boundary representation data according to claim 1, wherein after ridge line integration by the ridge line integrating means, the method further comprises the steps of:
  checking, by state check means, whether or not triangle groups satisfying predetermined conditions decreased as a result of ridge line integration; and
  simplifying, by simplifying means, a defective portion in a case where the predetermined conditions are not satisfied, and thereafter performing ridge line integration again by the ridge line integrating means.

3. The method of generating volume data from boundary representation data according to claim 1, wherein the volume data and the triangle patch having the phase are prepared, and set operations of nonboundary cells, the nonboundary cell to a boundary cell, and the boundary cell to the boundary cell are performed based on connected triangles.

4. A storage unit of a computer encoded with a program for generating volume data, wherein the program causes the computer to execute the steps of:
  (A) inputting boundary representation data of an object having a surface shape into a computer, wherein the boundary representation data inputted comprises three dimensionally shaped data;
  (B) converting the boundary representation data so that the boundary representation data is solidified or merged of a boundary line of a plane and converting surface shape into a triangle patch having a phase;
  (C) dividing a space into rectangular parallelepiped cells whose boundary planes cross one another at right angles to associate each cell with a triangle to be included in the associated cell;
  (D) dividing the triangle patch having the phase, floating in a space, by cell faces to bring a state in which all the triangles are arranged inside associated cells and on a boundary;
  (E) integrating ridge lines without changing the phase, and in whether or not the following conditions are satisfied
    i. there is not any triangle vertex in a cell body or on a cell surface;
    ii. there is only one vertex of the triangle patch on the cell edge; and
    iii. a phenomenon does not occur in which the phase changes by integrating the cutting points;
  (F) assigning each triangle and a vertex of the triangle to the associated cell with reference to index data of the vertex; and
  (G) setting an attribute value of each cell.

5. The storage unit of a computer encoded with a program for generating volume data according to claim 3, wherein after the step of ridge line integration the program causes the computer to execute the further steps of:
  checking whether or not triangle groups satisfying predetermined conditions decreased as a result of ridge line integration; and
  simplifying a defective portion in a case where the predetermined conditions are not satisfied, and thereafter performing
  ridge line integration again.

6. The storage unit of a computer encoded with a program for generating volume data according to claim 4, wherein the volume data and the triangle patch having the phase are prepared, and set operations of nonboundary cells, the nonboundary cell to a boundary cell, and the boundary cell to the boundary cell are performed based on connected triangles.

7. The method of generating volume data from boundary representation data according to claim 2, wherein the volume data and the triangle patch having the phase are prepared, and set operations of nonboundary cells, the nonboundary cell to a boundary cell, and the boundary cell to the boundary cell are performed based on connected triangles.

8. The storage unit of a computer encoded with a program for generating volume data according to claim 5, wherein the volume data and the triangle patch having the phase are prepared, and set operations of nonboundary cells, the nonboundary cell to a boundary cell, and the boundary cell to the boundary cell are performed based on connected triangles.

* * * * *